United States Patent [19]

Kanuma et al.

[11] Patent Number: 4,802,133

[45] Date of Patent: Jan. 31, 1989

[54] LOGIC CIRCUIT

[75] Inventors: Akira Kanuma; Toshiyuki Yaguchi, both of Yokohama, Japan

[73] Assignee: Kabushiki Kaisha Toshiba, Kawasaki, Japan

[21] Appl. No.: 844,341

[22] Filed: Mar. 26, 1986

[30] Foreign Application Priority Data

Mar. 26, 1985 [JP] Japan .................................. 60-61202
Mar. 26, 1985 [JP] Japan .................................. 60-61203

[51] Int. Cl.$^4$ ............................................. G11C 8/00
[52] U.S. Cl. ................... 365/230; 365/201
[58] Field of Search ................ 365/201, 230, 189; 371/21, 25; 377/28

[56] References Cited

U.S. PATENT DOCUMENTS

| | | | |
|---|---|---|---|
| 3,961,254 | 6/1976 | Cavaliere et al. | 324/73 AT |
| 4,140,967 | 2/1979 | Balasubramanian et al. | 324/73 R |
| 4,212,026 | 7/1980 | Balasubramanian et al. | 357/41 |
| 4,424,581 | 1/1984 | Kawai | 365/189 X |
| 4,669,061 | 5/1987 | Bhavsar | 365/201 X |

FOREIGN PATENT DOCUMENTS 2826722 1/1979 Fed. Rep. of Germany .

OTHER PUBLICATIONS

Eichelberger, E. B., et al, "A Logic Design Structure for LSI Testability", Proc. Design Automation Workshop 14th, 1977, pp. 462, 468.

"Patent Abstracts of Japan", vol. 7, No, 282 (p-243) [1427], Dec. 16, 1983.

Primary Examiner—Joseph A. Popek
Attorney, Agent, or Firm—Foley & Lardner, Schwartz, Jeffery, Schwaab, Mack, Blumenthal & Evans

[57] ABSTRACT

A logic circuit which can easily perform a logical function test is disclosed. A first type of the logic circuit comprises a combinational circuit having a plurality of internal nodes, node data latch circuits respectively connected to the preselected internal nodes for latching their logical states, and readout means for reading data latched in the latch circuits by using a data transfer clock. Further, there may be adopted implementation such that the node data latch circuit functions to allow a predetermined node to be placed in the logical state latched in the node data latch circuit. Thus, this first type of the logic circuit makes it possible to monitor even logical states of internal nodes of the combinational circuit. A second type of the logic circuit comprises a combinational circuits, a plurality of memory means, designation means e.g. a flip-flops provided per each memory means for designating whether an access to the memory means is enabled or not, access means for providing an access to the memory means designated by the designation means, and means for setting designation data to the designation means. Further, there may be provided an address decoder for decoding addresses assigned to the respective designation means. Thus, the second type of the logic circuit can implement a logical function test with less additional circuitry and wiring and in a simplified control mode. In addition, the combination of the first and second types of the logic circuits is also possible.

15 Claims, 9 Drawing Sheets

LOGIC CIRCUIT

BACKGROUND OF THE INVENTION

The present invention relates to a logic circuit which can easily effect a logical function test.

The test of a logic integrated circuit is generally classified into a dc characteristic test for testing a dc characteristic of the circuit, an ac characteristic test for testing an ac characteristic thereof, and a logical function test for testing a logical function thereof. Particularly, the logical function test is necessarily carried out not only in a quality decision test in a mass production line, but also in an acceptance test for a user. It is important to know how to properly and efficiently perform such a logical function test.

Where a test in a mass production line is carried out, there has been adopted in the art a method of bringing a needle into direct contact with a semiconductor chip on which logic integrated circuits are formed to monitor logical states of required nodes. However, with respect to logical integrated circuits which have been increasingly miniaturized, it has been extremely difficult to precisely bring a needle into contact with nodes to be monitored with such a method. Further, there are recently many cases where logic integrated circuits are designed using an automatic placement and routing program. As a result, it has been also difficult to precisely specify a desired node. As stated above, there exist many drawbacks with the method of bringing a needle into direct contact with a semiconductor chip to monitor the status of required nodes.

For facilitating the logical function test, there has been known a method called the LSSD (Level Sensitive Scan Design) technique. According to this method, flip-flops are added to registers in the logic circuit to connect these flip-flops in series, thus to monitor data of respective registers. However, this method can monitor only the data of registers. Namely, only the data indicative of the result output from a combinational circuit can be monitored. Accordingly, where the data indicative of the result is not correct, there is difficulty in specifying which portion in the combinational circuit has failured on the basis of the data indicative of the result. Particularly, in the case of large scale combinational circuits, such a difficulty is serious.

For another system for facilitating the logical function test, the scan pass system and the parallel scan pass system have been known in the art. According to the scan pass system, flip-flops are connected to memory elements e.g. flip-flops or registers etc. connected to a combinational circuit in a logic circuit, respectively, and these flip-flops are connected so as to constitute a shift register. At the time of the logic function test, first one inputs initial data into these memory elements in a test mode to perform a required operation with the combinational circuit in an operational mode; thereafter one reads data indicative of the result from these memory elements in the test mode for a second time. This scan pass system is an extremely effective method in the case where flip-flops are distributed in the logic circuit. However, this system requires the provision of a flip-flop per each flip-flop in the logic circuit, with the result that the additional circuit becomes large when a logic circuit having a large number of flip-flops is used.

On the other hand, the parallel scan system is a system adapted to assign addresses to memory elements e.g. flip-flops or registers etc. to provide an access to these memory elements by making use of the addresses. However, with this system, there is a need to assign addresses to the memory elements from the external or to set addresses to an address register. In addition, for providing an access to the respective memory elements, a circuit for decoding addresses and wiring for delivering an access enable signal to the respective memory elements are required. For this reason, where logic circuits of the parallel scan system are integrated, external terminals for delivering addresses to the memory elements are required and an additional internal wiring is increased.

SUMMARY OF THE INVENTION

A first object of the present invention is to provide a logic circuit making it possible to monitor even logical states of nodes in a combinational circuit, thus to facilitate a logical function test.

A second object of the present invention is to provide a logic circuit which requires less additional circuits and wiring and is controlled in a simplified manner, thus making it possible to easily carry out a logical function test.

The above-mentioned objects are realized by the provision of a logic circuit comprising a combinational circuit, latch circuits connected to a plurality of nodes in the combinational circuit, and readout means for reading data latched in the latch circuit.

Further, the above-mentioned objects are realized by the provision of a logic circuit comprising a combinational circuit, a plurality of memory means connected to the combinational circuit, designation means provided per each memory means for designating whether an access to each memory means is enabled or not, access means for reading data from the memory means designated by the designation means for writing data in the memory means designated, and means for setting designation data to the designation means.

DETAILED DESCRIPTION OF THE INVENTION

The present invention will be described in detail in connection with preferred embodiments with reference to accompanying drawings.

Figure 1:
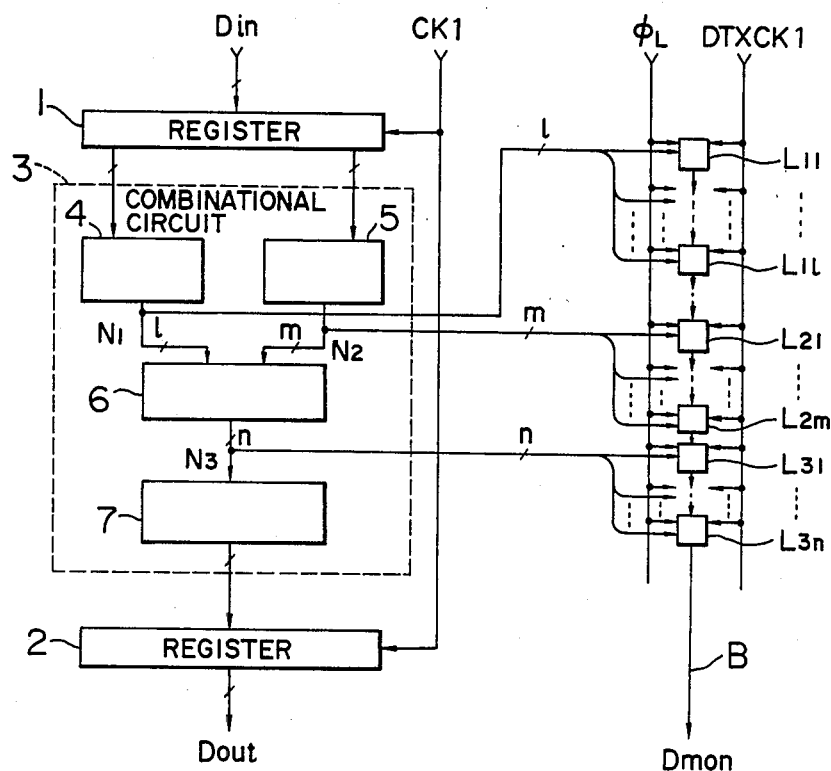
FIG. 1 is a circuit diagram illustrating a first embodiment of a logic circuit according to the present invention.

Initially, referring to FIG. 1, there is shown a preferred first embodiment of a logic circuit according to the present invention. This logic circuit essentially functions to effect logical operation of externally generated input data $D_{in}$ to output the result which has undergone the logical operation as an output data $D_{out}$. To realize this function, the logic circuit comprises a register 1 for storing the input data $D_{in}$, a large scale combinational circuit 3 for effecting logical operation, and a register 2 for storing the output data $D_{out}$. The large scale combinational circuit 3 is divided into small scale combinational circuits 4, 5, 6 and 7 according to functions. The combinational circuit 3 is provided therein with an internal node $N_1$ of the combinational circuits 4 and 6, an internal node $N_2$ of the combinational circuits 5 and 6, and an internal node $N_3$ of the combinational circuits 6 and 7. Each wiring drawn from these preselected internal nodes $N_1$, $N_2$ and $N_3$ is connected to data latch circuits $L_{11}$ to $L_{1l}$, $L_{21}$ to $L_{2m}$, and $L_{31}$ to $L_{3n}$. More particularly, the data latch circuits $L_{11}$ to $L_{1l}$ are connected to respective bits of the internal node $N_1$ of $l$ bits. Likewise, the data latch circuits $L_{21}$ to $L_{2m}$ are connected to respective bits of the internal node $N_2$ of $m$ bits. In addition, the data latch circuits $L_{31}$ to $L_{3n}$ are connected to respective bits of the internal Node $N_3$ of $n$ bits. These data latch circuits $L_{11}$ to $L_{1l}$, $L_{21}$ to $L_{2m}$ and $L_{31}$ to $L_{3n}$ are connected in series so as to constitute a shift register, respectively. To each data latch circuit, a latch signal $\Phi_L$ and a data transfer clock DTXCK1 are input.

The operation of the logic circuit thus configured will now be described. At the time of a logical function test, the latch signal $\Phi_L$ is output at a predetermined timing for latching data. Thus, logical states of the respective nodes $N_1$ to $N_3$ are latched in the data latch circuits $L_{11}$ to $L_{3n}$. Subsequently, when the data transfer clock DTXCK1 is output, data thus latched are sequentially transferred in the data latch circuits $L_{11}$ to $L_{3n}$. Then, they are output bitwise through a common bus B as monitor data $D_{mon}$.

As stated above, the logic circuit according to this embodiment can externally read the logical states of the internal nodes in the large scale combinational circuit and thus to recognize which portion in the large scale combinational circuit is failed.

Figure 2:
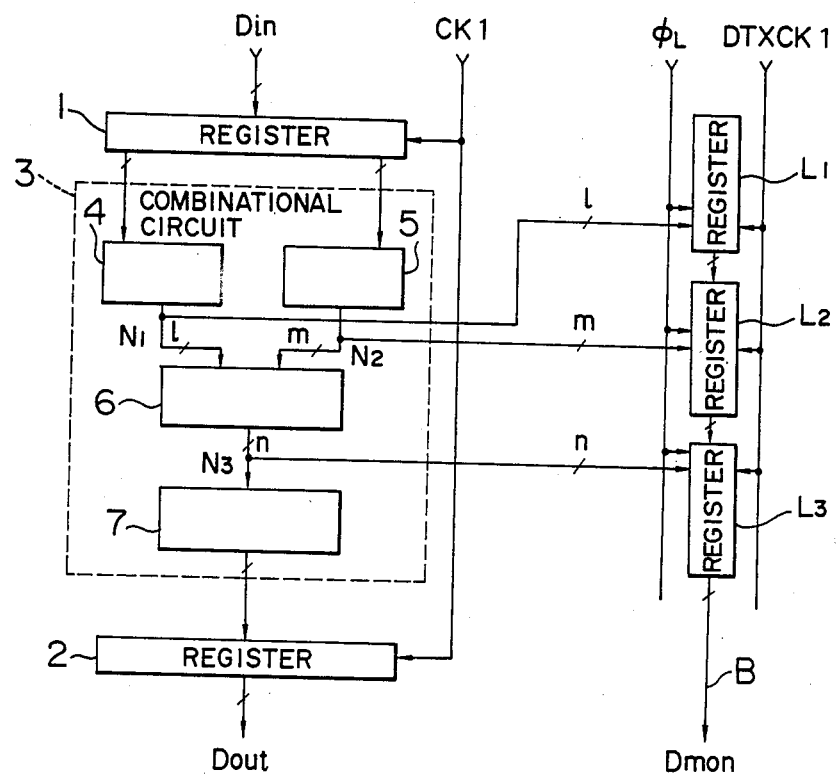
FIG. 2 is a circuit diagram illustrating a second embodiment of a logic circuit according to the present invention.

A preferred second embodiment of a logic circuit according to the present invention will be described with reference to FIG. 2. This embodiment is characterized in that data latch circuit $L_1$, $L_2$ and $L_3$ are constituted with registers of the same bit number as the internal nodes $N_1$, $N_2$ and $N_3$. Namely, the data latch circuit $L_1$ has $l$ bits, the data circuit $L_2$, $m$ bits, and the data circuit $L_3$, $n$ bits. To these data latch circuits $L_1$, $L_2$ and $L_3$, the latch signal $\Phi_L$ and the data transfer clock DTXCK1 are input. Data latched in the data latch circuits $L_1$, $L_2$ and $L_3$ by the latch signal $\Phi_L$ are transferred in the data latch circuits $L_2$ to $L_3$ in synchronism with the data transfer clock DTXCK1. The data thus transferred is read at the same time with plural bits being as a unit through the common bus B as the monitor data $D_{mon}$. As stated above, the logic circuit according to this embodiment is configured to read a test data at the same time with plural bits being as a unit, thus making it possible to read data within a short time period.

Figure 3:
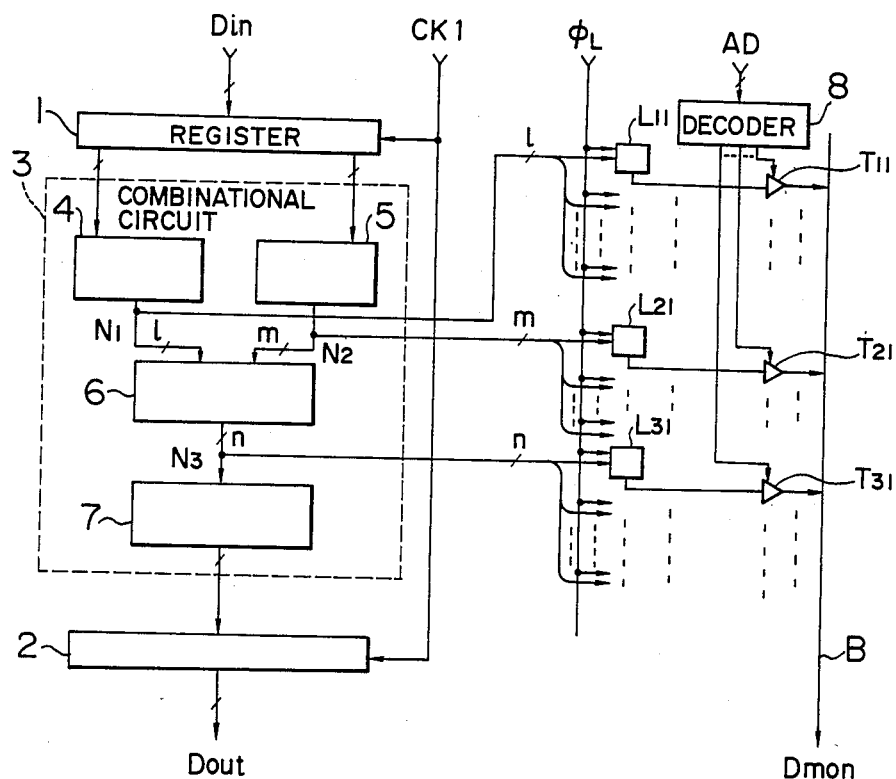
FIG. 3 is a circuit diagram illustrating a third embodiment of a logic circuit according to the present invention.

A preferred third embodiment of a logic circuit according to the present invention will be described with reference to FIG. 3. In this embodiment, with respect to the data latch circuits $L_{11}$ to $L_{1l}$, $L_{21}$ to $L_{2m}$ and $L_{31}$ to $L_{3n}$ of one bit configuration, tristate buffers $T_{11}$ to $T_{1l}$, $T_{21}$ to $T_{2m}$ and $T_{31}$ to $T_{3n}$ functioning as switching gates are provided, respectively. Control signals for these tristate buffers $T_{11}$ to $T_{3n}$ are input from a decoder 8. The decoder 8 is operative to decode an address signal AD as input to output a control signal to the tristate buffer coupled to the data latch circuit designated by the address. Thus, data of the data latch circuit designated is output as monitor data $D_{mon}$ through the common bus B. The logic circuit according to this embodiment can directly designate an arbitrary data latch circuit, thus to efficiently read the test data.

Figure 4:
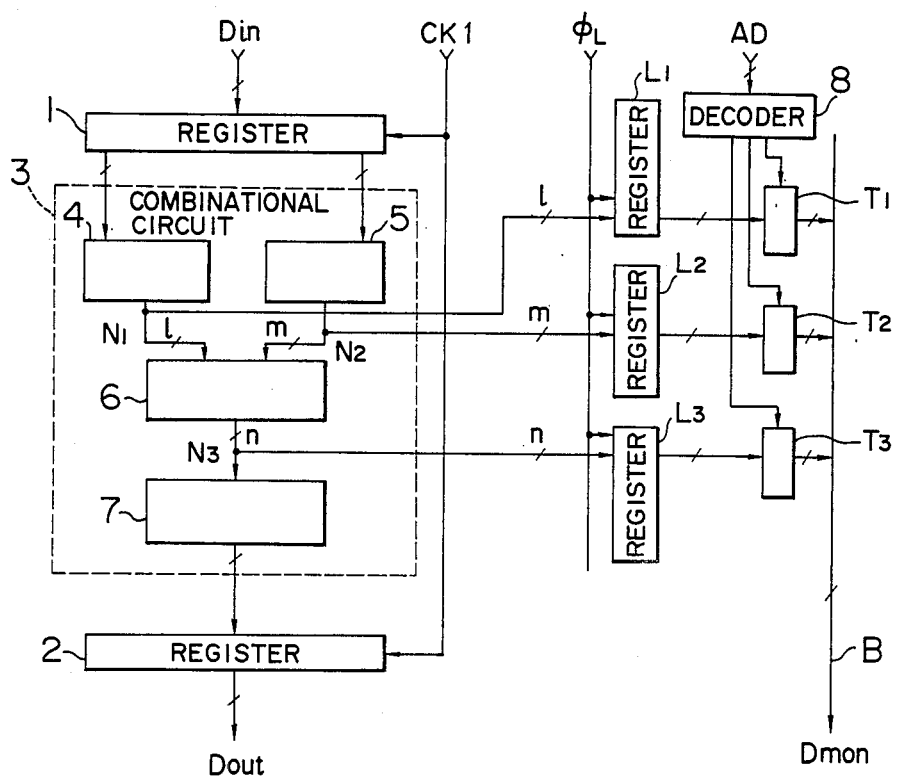
FIG. 4 is a circuit diagram illustrating a fourth embodiment of a logic circuit according to the present invention.

A preferred fourth embodiment of a logic circuit according to the present invention will be described with reference to FIG. 4. This embodiment is characterized in that data latch circuits $L_1$, $L_2$ and $L_3$ are constituted with registers of $l$, $m$ and $n$ bits of the internal nodes $N_1$, $N_2$ and $N_3$, respectively, and that tristate buffers $T_1$, $T_2$ and $T_3$ have corresponding $l$, $m$ and $n$ buffers, respectively. An address signal AD input is decoded in the decoder 8. A decoded signal is input to a corresponding one of tristate buffers $T_1$, $T_2$ and $T_3$. Thus, a tristate buffer coupled to the data latch circuit designated by the decoded signal is placed in condition for connection. The data from the data latch circuit is output as monitor data $D_{mon}$ of plural bits through the common bus B. As stated above, this embodiment can directly designate an arbitrary test data as a group of plural bits, thus to efficiently read the test data with high speed.

Figure 5:
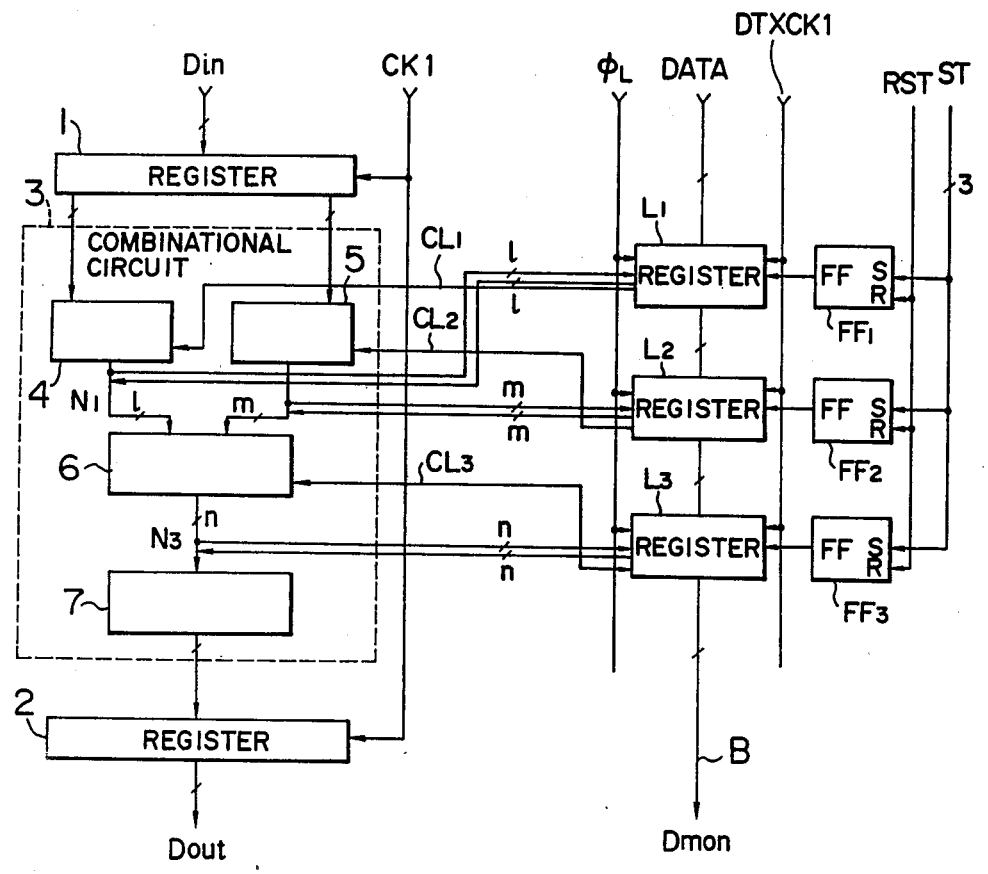
FIG. 5 is a cicuit diagram illustrating a fifth embodiment of a logic circuit according to the present invention.

A preferred fifth embodiment of a logic circuit according to the present invention will be described with reference to FIG. 5. This embodiment is proposed with a view to improving the above-mentioned second embodiment, and is characterized in that not only the registers $L_1$, $L_2$ and $L_3$ latch logical states of the nodes $N_1$, $N_2$ and $N_3$, but also allows logical states of the nodes $N_1$, $N_2$ and $N_3$ to be in conformity with those latched in the registers $L_1$, $L_2$ and $L_3$. Since the registers $L_1$, $L_2$ and $L_3$ are connected in series, an input data is sequentially transferred in the registers $L_1$, $L_2$ and $L_3$ in synchronism with the data transfer clock DTXCK1. The registers $L_1$, $L_2$ and $L_3$ are connected to the combinational circuits 4, 5 and 6 by means of control signal lines $C_{L1}$, $C_{L2}$ and $C_{L3}$, respectively. Where a logic signal is written from the registers $L_1$, $L_2$ and $L_3$ into the nodes $N_1$, $N_2$ and $N_3$, an output of signals from the combinational circuits 4, 5 and 6 to the respective nodes $N_1$, $N_2$ and $N_3$ is disabled by control signals delivered through the above-mentioned control signal lines $C_{L1}$, $C_{L2}$ and $C_{L3}$.

Further, to the registers $L_1$, $L_2$ and $L_3$, flip-flops $FF_1$, $FF_2$ and $FF_3$ are connected, respectively. These flip-flops FF$_1$, FF$_2$ and FF$_3$ are set or reset in response to a set signal ST or a reset signal RST. Whether these registers L$_1$, L$_2$ and L$_3$ read logic signals of the nodes N$_1$, N$_2$ and N$_3$ or write logic signals into the nodes N$_1$, N$_2$ and N$_3$ is determined by the fact that the flip-flop FF$_1$, FF$_2$ and FF$_3$ are set or reset.

As stated above, this embodiment makes it possible to read the logical states of the nodes and to allow the nodes to be placed in a desired logical state, thus to realize various logical function tests.

Figure 6:
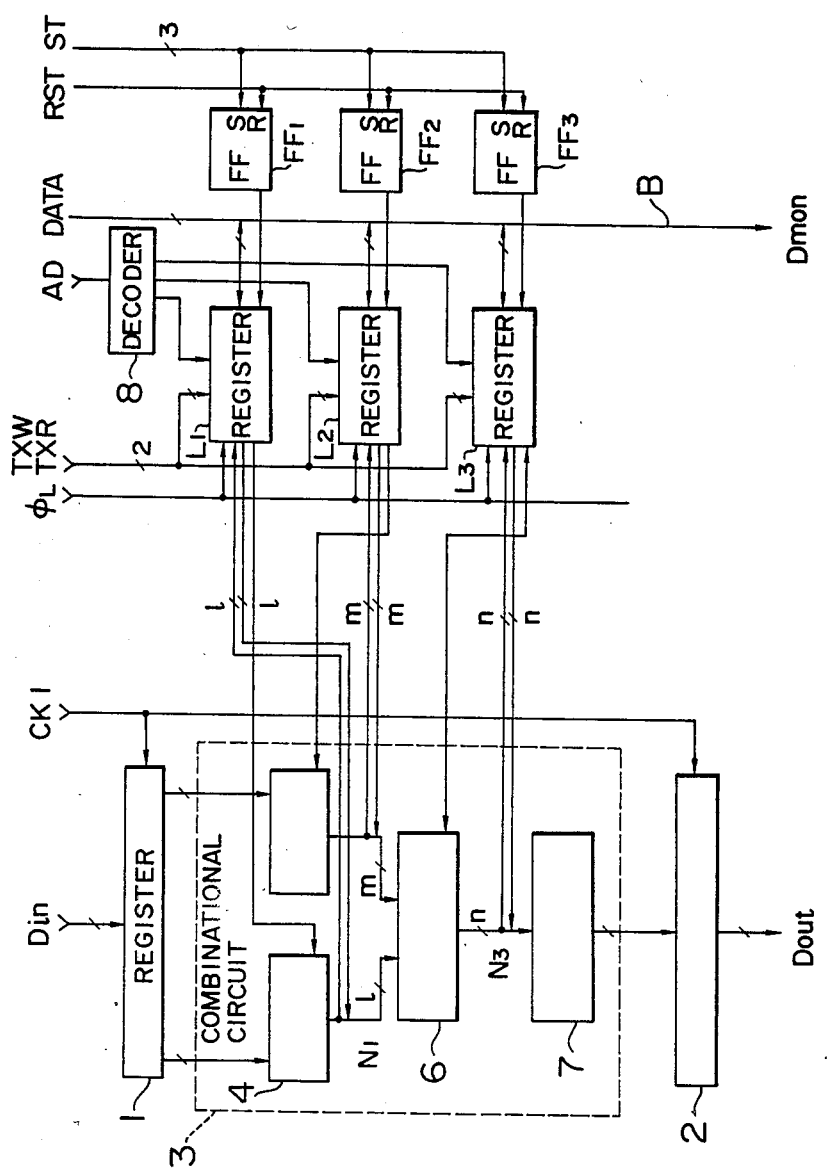
FIG. 6 is a circuit diagram illustrating a sixth embodiment of a logic circuit according to the present invention.

A preferred sixth embodiment of a logic circiut according to the present invention will be described with reference to FIG. 6. In this embodiment, the registers L1, L2 and L3 are not connected in series as in the above-mentioned fifth embodiment, but the respective registers are independently connected to the bus line B. Whether data is read from which register (L$_1$, L$_2$ or L$_3$) or is written into which register is determined by a signal decoded from the decoder 8, a readout signal TXR and a write signal TXW. The decoder 8 decodes addresses indicative of location of the registers L$_1$, L$_2$ and L$_3$ to output signals thus decoded to the respective registers L$_1$, L$_2$ and L$_3$. As stated above, even in the case where there exits a large number of nodes to be monitored, this embodiment can designate a desired nodes by making use of address to write data into the register or read it therefrom, thus realizing a high speed logical function test.

As seen from the foregoing description, the logic circuits according to the aforementioned first to sixth embodiments can securely monitor internal nodes of the combinational circuit. Accordingly, where a logic circuit having a large scale combinational circuit is evaluated, by dividing the combinational circuit into suitable unit circuits to monitor nodes of respective unit circuits, it is possible to efficiently perform failure analysis with a small number of test vectors, thus facilitating the logical function test.

Figure 7:
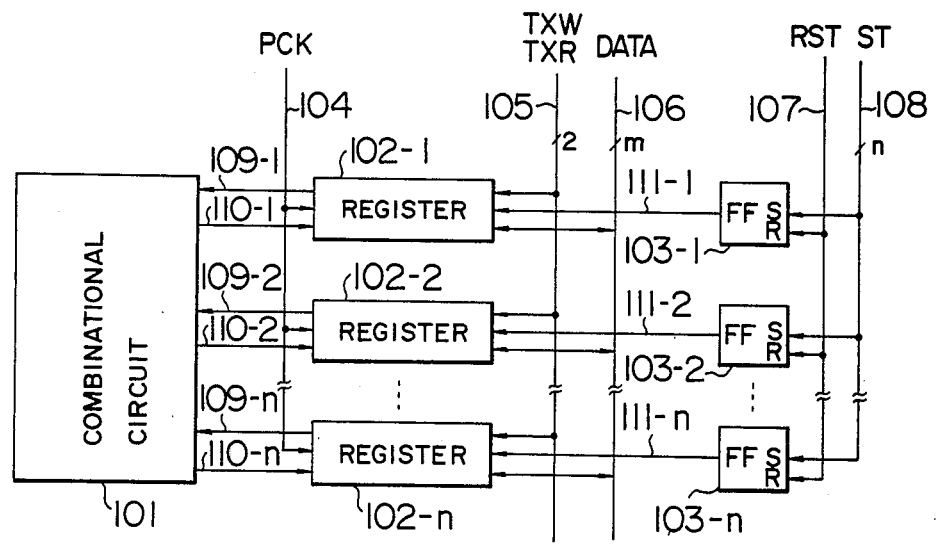
FIG. 7 is a circuit diagram illustrating a seventh embodiment of a logic circuit according to the present invention.

A preferred seventh embodiment of a logic circuit according to the present invention will be described with reference to FIG. 7. In this logic circuit, an essential logical operation is performed by a combinational circuit 101. To the combinational circuit 101, registers 102-1 to 102-n of multibits are connected by means of input signal lines 109-1 to 109-n and output signal lines 110-1 to 110-n. Input data to the combinational circuit 101 and output data therefrom etc. are stored in these registers 102-1 to 102-n. To the registers 102-1 to 102-n, a clock PCK for logical operation is input to the registers 102-1 to 102-n.

Further, to the registers 102-1 to 102-n, a control signal line 105 and a data bus 106 are connected wherein the control signal line 105 is used for use in input of a write signal TXW for test and a readout signal TXR for test, and the data bus 106 is used for input/output of a data signal DATA. In a test mode, by inputting the write signal TXW for test, the data DATA is written into the registers 102-1 to 102-n, and by inputting the readout signal TXR for test, the data DATA is read out from the registers 102-1 to 102-n.

Furthermore, to the registers 102-1 to 102-n, flip-flops (FF) 103-1 to 103-n are connected through signal lines 111-1 to 111-n, respectively. These flip-flops 103-1 to 103-n are provided for designating whether an access to the registers 102-1 to 102-n is enabled or disabled. To the flip-flops 103-1 to 103-n, a reset signal line 107 and a set signal line 108 are connected. By the reset signal RST and the set signal ST, designation data is set to the flip-flops 103-1 to 103-n.

The logic circuit is thus configured and an example of the operation thereof in a test mode will now be described wherein the operation is carried out to write data into e.g. the register 102-1 to perform logical operation in the combinational circuit 101, thereafter to read the data representing the result of the logical operation from the register 102-2. The first step is to reset all the flip-flops 103-1 to 103-n by the reset signal RST, and thereafter to set only the flip-flop 103-1 by the set signal ST. Thus, an access to the register 102-1 is enabled while an access to other registers 102-2 to 102-n is disabled. The next step is to input the write signal TWX for test and a predetermined data signal DATA to write a predetermined data into the register 102-1. Subsequently, the test mode is switched to an operational mode to perform logical operation in the combinational circuit 101 by using data of the register 102-1. After the data indicative of the result is output to the register 102-2, the operational mode is again switched to the test mode. The next step is to reset the flip-flop 103-1 by the reset signal RST, thereafter to set the flip-flop 103-2 by the set signal ST. Thus, only the register 102-2 is placed in accessible condition. Finally, the readout signal TXR for test is input, thereby to read the data indicative of the result from the register 102-2 through the data bus 106.

As stated above, this embodiment can provide an access to an arbitrary register by only adding an extremely small number of flip-flops as compared to the number of whole bits of the register.

Figure 8:
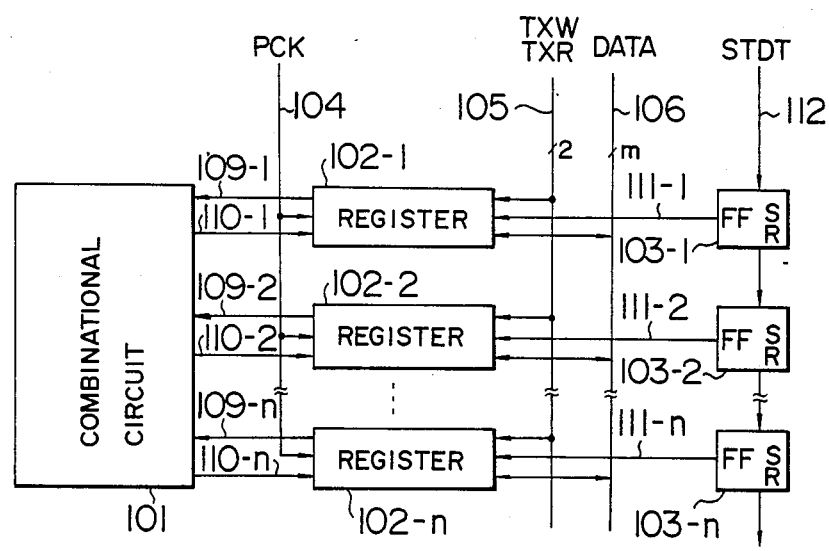
FIG. 8 is a circuit diagram illustrating an eighth embodiment of a logic circuit according to the present invention.

A preferred eighth embodiment of a logic circuit according to the present invention will be described with reference to FIG. 8. This embodiment differs from the seventh embodiment in the method of setting designation data to the flip-flops 103-1 to 103-n. In this embodiment, the flip-flops 103-1 to 103-n are connected in series and a set data signal line 112 is connected to the first stage of the flip-flop 103-1. The setting of the designation data to the flip-flops 103-1 to 103-n is made by serially inputting the set data STDT from the set data signal line 112. For instance, in the case where the flip-flop 103-1 is required to be set for enabling only the register 102-1, such a set operation can be effected by sequentially inputting the set data STDT to the set data signal line 112.

According to this embodiment, it is possible to set designation data to the flip-flops with extremely less additional wiring.

Figure 9:
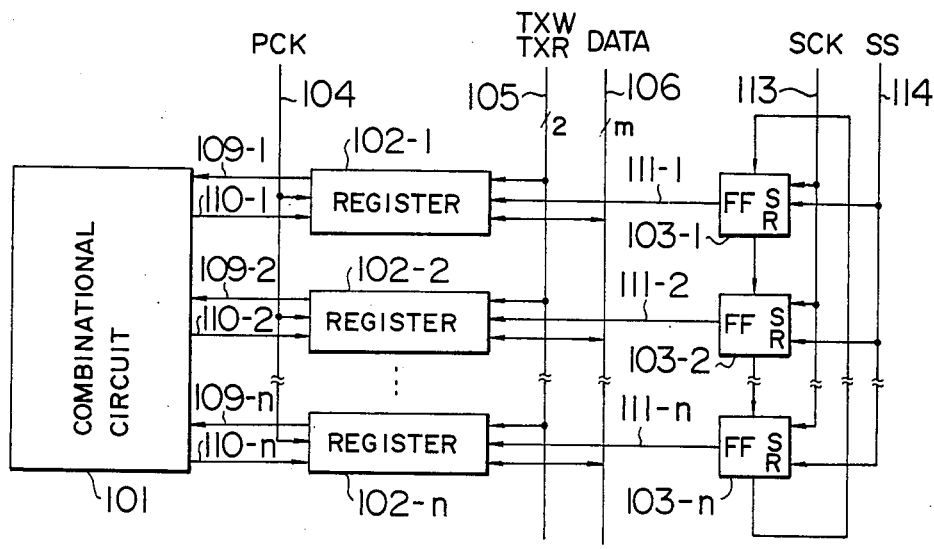
FIG. 9 is a circuit diagram illustrating a ninth embodiment of a logic circuit according to the present invention.

A preferred ninth embodiment of a logic circuit according to the present invention will be described with reference to FIG. 9. In this embodiment, flip-flops 103-1 to 103-n coupled to the registers 102-1 to 102-n are connected in a ring-shaped manner. Namely, the flip-flops 103-1 to 103-n are connected in series, and the final stage of the flip-flop 103-n is connected to the first stage of the flip-flop 103-1. Further, to these flip-flops 103-1 to 103-n, a shift clock SCK is input through a signal line 113. In addition, a set signal SS for designation data is input to the respective flip-flops 103-1 to 103-n through the signal line 114. This signal line 114 is connected to e.g. a set input terminal S of the flip-flop 103-1 and reset input terminals R of the flip-flops 103-2 to 103-n. Accordingly, when the set signal SS is input, only the flip-flop 103-1 is set to represent logical "1" while other flip-flops 103-2 to 103-n are all reset to represent logical "0". When other flip-flops are required to be set, a predetermined number of pulses are input as the shift clock SCK to transfer the designation data by turn. For instance, in the case where it is required to set the fourth flip-flop 103-4 to provide an access to the register 102-4, the first step is to input the set signal SS to set the flip-flop 103-1 to a logical "1", and thereafter to input three shift clock pulses SCK to transfer the designation data by three stages.

Thus, this embodiment can set data to an arbitrary flip-flop with less signal lines and simple control signals.

Figure 10:
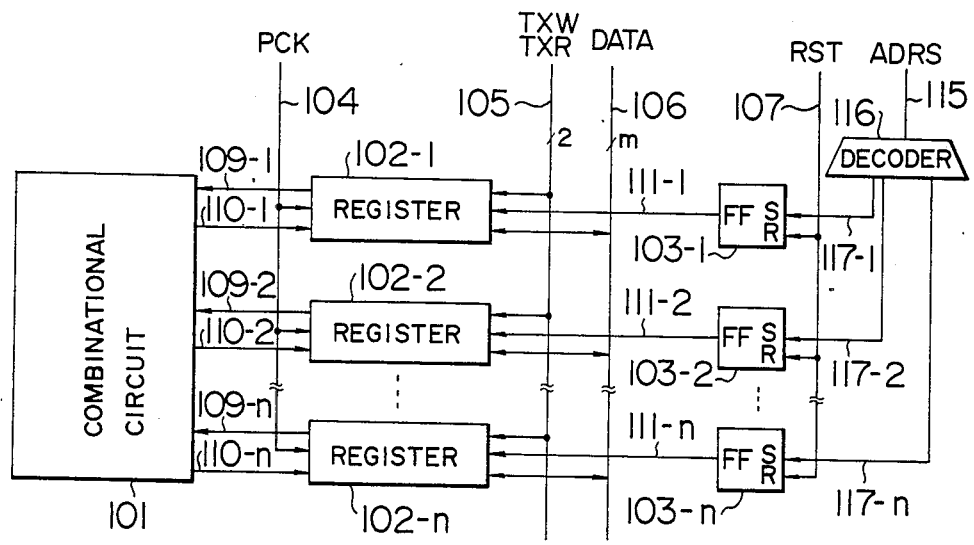
FIG. 10 is a circuit diagram illustrating a tenth embodiment of a logic circuit according to the present invention.

A preferred tenth embodiment of a logic circuit according to the present invention will be described with reference to FIG. 10. In this embodiment, there is provided a decoder 116 for setting designation data to the flip-flops 103-1 to 103-n. This decoder 116 is operative to decode an address ADRS input through a signal line 115 to output a set signal to the flip-flop assigned to the address. For an address for designating a flip-flop, high-order bits of addresses successively attached to the registers 102-1 to 102-n may be used, or addresses individually determined with respect to the flip-flops 103-1 to 103-n may be used. To the set input terminals S of the flip-flops 103-1 to 103-n, signal lines 117-1 to 117-n from the decoder 116 are connected, respectively. Further, to the reset input terminals R thereof, a reset signal line 107 is commonly connected. The first step is to reset all the flip-flops 103-1 to 103-n by the reset signal RST, and thereafter to input an address ADRS of the flip-flop to be set to the decoder 116. The decoder 116 decodes the address ADRS thus input to output a set signal to a predetermined flip-flop.

As stated above, this embodiment is configured to input an address to the flip-flop to be set, thereby making it possible to directly set a desired flip-flop, and thus to quickly carry out the logical function test.

As seen from the foregoing description, the logic circuits according to the seventh to tenth embodiments can provide an access to only an arbitrary memory means with less additional circuits and additional wiring, thus easily and promptly implementing the logical function test.

Figure 11:
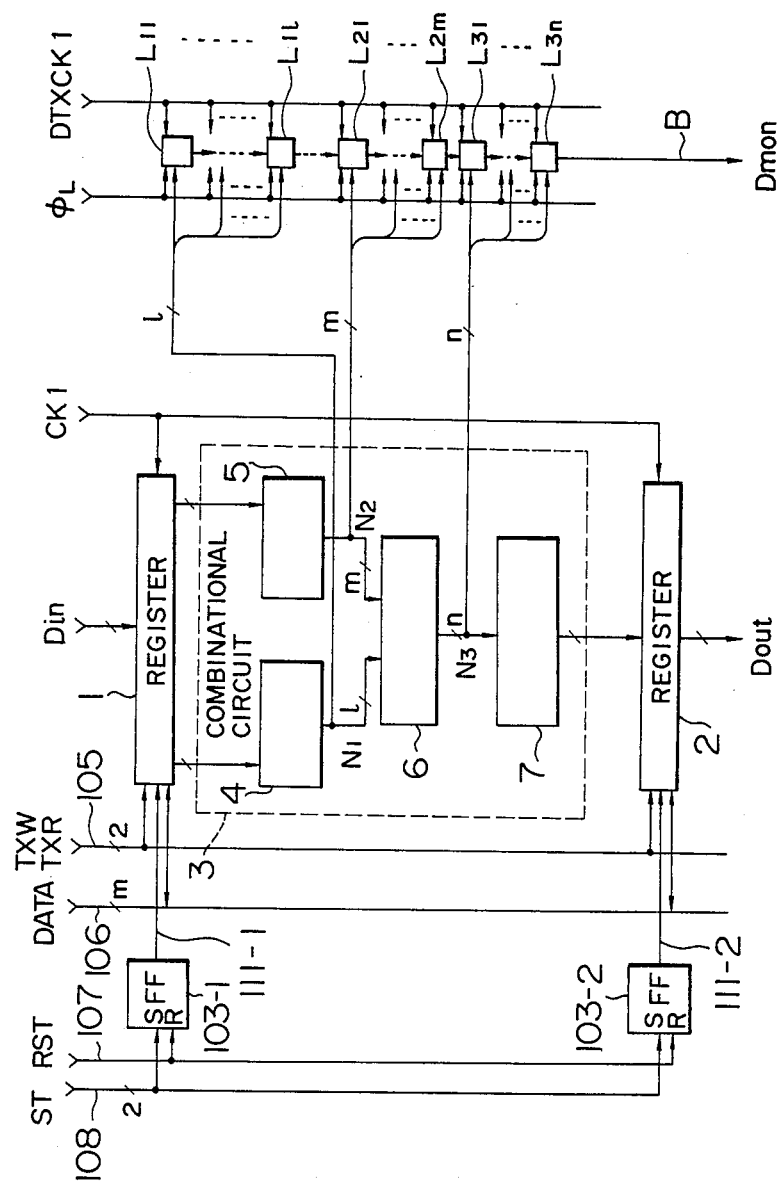
FIG. 11 is a circuit diagram illustrating an eleventh embodiment of a logic circuit according to the present invention.

A preferred eleventh embodiment of a logic circuit according to the present invention will be described with reference to FIG. 11. This embodiment is configured combining the first embodiment with the seventh embodiment. Similarly to the first embodiment, the combinational circuit 3 includes small scale combinational circuits 4, 5, 6 and 7. Each wiring is drawn from the internal node $N_1$ of the circuits 4 and 6, the internal node $N_2$ of the combinational circuits 5 and 6 and the internal node $N_3$ of the combinational circuits 6 and 7, and is connected to the data latch circuits $L_{11}$ to $L_{1l}$, $L_{21}$ to $L_{2m}$, and $L_{31}$ to $L_{3n}$. More particularly, the data latch circuits $L_{11}$ to $L_{1l}$ are connected to respective bits of the internal node $N_1$ of l bits. Likewise, the data latch circuits $L_{21}$ to $L_{2m}$ are connected to respective bits of the internal node $N_2$ of m bits. In addition, the data latch circuits $L_{31}$ to $L_{3n}$ are connected to respective bits of the internal node $N_3$ of n bits. These data latch circuits $L_{11}$ to $L_{1l}$, $L_{21}$ to $L_{2m}$ and $L_{31}$ to $L_{3n}$ are connected in series so as to consitute a shift register, respectively. To each data latch circuit, a latch signal $\Phi_L$ and a data transfer clock DTXCK1 are input.

Further, to the registers 1 and 2, the control signal line 105 and the data bus 106 are connected wherein the control signal line 105 is used for use in input of a write signal TXW for test and the readout signal TXR for test, and the data bus 106 is used for input/output of the data signal DATA. In a test mode, by inputting the write ingnal TXW for test, the data DATA is written into the resigters 1 and 2, and by inputting the readout signal TXR for test, the data DATA is read out from the registers 1 and 2.

Furthermore, to the registers 1 and 2, flip-flops (FF) 103-1 to 103-2 are connected through signal lines 111-1 and 111-2, respectively. These flip-flops 103-1 and 103-2 are provided for designating whether an access to the registers 1 to 2 is enabled or disabled. To the flip-flops 103-1 and 103-2, the reset signal line 107 and the set signal line 108 are connected. By the reset signal RST and the set signal ST, designation data is set to the flip-flops 103-1 to 103-2.

Since the operation of this embodiment is the same as those of the first and seventh embodiments, its explanation will be omitted.

The logic circuit according to this embodiment makes it possible to monitor internal nodes in the combinational circuit and to provide an access to the registers.

The present invention is not limited to the above-mentioned embodiments, but various modifications are possible. In the above-mentioned eleventh embodiment, the first and seventh embodiments are combined. Instead, one of the first to sixth embodiments may be combined with one of the seventh to tenth embodiments.

What is claimed is:

1. A logic circuit comprising:
   a combinational circuit having a plurality of internal nodes;
   a plurality of latch circuits respectively connected to preselected internal nodes of said plurality of internal nodes for latching logical states thereof; and
   readout means for reading data latched in said respective latch circuits,
   wherein said readout means comprises:
   a bus line for transmitting said data read from said latch circuit,
   an address decoder for decoding addresses indicative of a location of said latch circuits, and
   gates interconnected between said latch circuits and said bus line for effecting a switching operation in response to signals decoded from said address decoder,
   wherein said readout means reads data in the latch circuit and transfers same to said bus line.

2. A logic circuit according to claim 1, wherein said latch circuits are connected in series, said readout means sequentially transferring data latched in said latch circuits in synchronism with a data transfer clock to read the data transferred.

3. A logic circuit comprising:
   a combinational circuit having a plurality of internal nodes;
   a plurality of memory means respectively connected to selected internal nodes of said plurality internal nodes;
   means for allowing said memory means to latch logical states of said preselected internal nodes and for allowing said memory means to output logical states latched in said memory means to said preselected internal nodes; and
   an address decoder for decoding addresses specifying ones of said memory means, data being inputted into the memory means selected by signals decoded by said address decoder or being outputted therefrom.

4. A logic circuit according to claim 3, wherein said plurality of memory means are connected in series to serially input data to said plurality of memory means connected in series or output data therefrom.

5. A logic circuit comprising:
a combinational circuit;
a plurality of memory means connected to said combinational circuit;
designation means provided per each of said plurality of memory means for designating whether an access to said memory means is enabled or not;
access means for reading data from the memory means designated by said designated means or writing data thereinto; and
means for setting designation data to said designation means,
wherein said setting means has means for decoding addresses of said plurality of designation means, designation data being set to designation means assigned to an address decoded by said decoding means.

6. A logic circuit according to claim 5, wherein said plurality of designation means are connected in series, and wherein said setting means serially inputs designation data in sequence to said plurality of designation means connected in series.

7. A logic circuit according to claim 5, wherein said plurality of designation means are connected in a ring-shaped manner, said setting means serially transferring designation data set in said plurality of designation means.

8. A logic circuit comprising:
a combinational circuit having a plurality of internal nodes;
a plurality of memory means connected to said combinational circuit;
designation means provided per each of said plurality of memory means for designating whether an access to said memory means is enabled or not;
accesss means for reading data from the memory means designated by said designation means or writing data thereinto;
means for setting designation data to said designation means;
latch means respectively connected to preselected internal nodes of said plurality of internal nodes for latching logical states of said preselected internal nodes; and
readout means for reading the data latched in said latch means,
wherein said readout means comprises a bus line for reading said data in said latch means, an address decoder for decoding addresses indicative of the location of said latch circuits, and gates interconnected between said latch ciruits and said bus line for effecting a switching operation in response to signals decoded from said address decoder, wherein said readout means reads data in the latch means and transfers same to said bus line.

9. A logic circuit according to claim 8, wherein said latch means are connected in series, said readout means sequentially transferring data latched in said latch means in synchronism with a data transfer clock to read the data transferred.

10. A logic circuit according to claim 8, wherein said plurality of designation means are connected in series, said setting means serially inputting designated data in sequence to said plurality of designation means connected in series.

11. A logic circuit according to claim 8, wherein said plurality of designation means are connected in a ring-shaped manner, said setting means sequentially transferring designation data set in said plurality of designation means.

12. A logic circuit according to claim 8, wherein said setting means has means for decoding addresses of said plurality of designation means, designation data being set to designation means assigned to an address decoded by said decoding means.

13. A logic circuit comprising:
a combinational circuit having a plurality of internal nodes;
a plurality of latch circuits respectively connected to preselected internal nodes of said plurality of internal nodes for latching logical states thereof, said plurality of latching circuits only connected for receiving data from said combinational circuit and not for supplying data thereto; and
readout means for reading data latched in said respective latch circuits,
wherein said readout means comprises:
a bus line for transmitting said data read from said latch circuit;
an address decoder for decoding addresses indicative of a location of said latch circuits; and
gates interconnected between said latch circuits and said bus line for effecting a switching operation in response to signals decoded from said address decoder;
wherein said readout means reads data in the latch circuit and transfers same to said bus line.

14. A logic circuit according to claim 13, wherein said latch circuits are connected in series, said readout means sequentially transferring data latched in said latch circuits in synchronism with a data transfer clock to read the data transferred.

15. A logic circuit comprising:
a combinational circuit having a plurality of internal nodes;
a plurality of memory means connected to said combinational circuit;
designation means provided per each of said plurality of memory means for designating whether an access to said memory means is enabled or not;
access means for reading data from the memory means designated by said designation means or writing data thereinto;
means for setting designation data to said designation means;
latch means respectively connected to preselected internal nodes of said plurality of internal nodes for latching logical states of said preselected internal nodes; and
readout means for reading the data latched in said latch means;
wherein said setting means has means for decoding addresses of said plurality of designation means, designation data being set to designation means assigned to an address decoded by said decoding means.

* * * * *